(12) United States Patent
Ihama

(10) Patent No.: US 9,006,566 B2
(45) Date of Patent: Apr. 14, 2015

(54) ORGANIC AND INORGANIC HYBRID PHOTOELECTRIC CONVERSION DEVICE

(75) Inventor: Mikio Ihama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 2403 days.

(21) Appl. No.: 11/476,606

(22) Filed: Jun. 29, 2006

(65) Prior Publication Data

US 2007/0012955 A1    Jan. 18, 2007

(30) Foreign Application Priority Data

Jun. 29, 2005  (JP) ............................. P. 2005-190146

(51) Int. Cl.
| | | |
|---|---|---|
| H01L 27/146 | (2006.01) | |
| H01L 27/30 | (2006.01) | |
| H01L 51/44 | (2006.01) | |
| H01L 51/42 | (2006.01) | |
| H01L 51/00 | (2006.01) | |

(52) U.S. Cl.
CPC ....... *H01L 27/14645* (2013.01); *H01L 51/0072* (2013.01); *H01L 27/307* (2013.01); *Y02E 10/549* (2013.01); *H01L 51/448* (2013.01); *H01L 51/4246* (2013.01); *H01L 27/14621* (2013.01); *H01L 51/0059* (2013.01); *H01L 51/0053* (2013.01); *H01L 27/14685* (2013.01); *H01L 51/0081* (2013.01)

(58) Field of Classification Search
USPC ................. 136/263; 348/272, 280; 257/431
See application file for complete search history.

(56) References Cited

U.S. PATENT DOCUMENTS

| | | | | |
|---|---|---|---|---|
| 3,076,861 A | * | 2/1963 | Samulon et al. | 136/257 |
| 4,438,455 A | | 3/1984 | Tabei | |
| 4,737,833 A | | 4/1988 | Tabei | |
| 4,924,282 A | * | 5/1990 | Komiyama et al. | 358/471 |
| 5,350,459 A | * | 9/1994 | Suzuki et al. | 136/263 |
| 5,488,601 A | * | 1/1996 | Sakano et al. | 369/120 |
| 6,054,363 A | * | 4/2000 | Sakaguchi et al. | 438/406 |
| 2003/0209651 A1 | * | 11/2003 | Iwasaki | 250/214.1 |
| 2005/0205903 A1 | * | 9/2005 | Hioki | 257/291 |
| 2005/0224113 A1 | * | 10/2005 | Xue et al. | 136/263 |

FOREIGN PATENT DOCUMENTS

| | | |
|---|---|---|
| JP | 58-103165 A | 6/1983 |
| JP | 61-193479 A | 8/1986 |
| JP | 2002-513145 A | 5/2002 |
| JP | 2003-332551 A | 11/2003 |
| JP | 2003-332552 A | 11/2003 |

OTHER PUBLICATIONS

Japanese Office Action issued Sep. 27, 2011 in corresponding Japanese Patent Application No. 2005-190146.

* cited by examiner

*Primary Examiner* — Thanh-Truc Trinh
(74) *Attorney, Agent, or Firm* — Sughrue Mion, PLLC

(57) ABSTRACT

A photoelectric conversion device comprising: an inorganic photoelectric conversion film; and an organic photoelectric conversion film, wherein an insulating film between the inorganic photoelectric conversion film and the organic photoelectric conversion film has a thickness of from 1 to 6 μm, wherein the organic photoelectric conversion film has a multilayer structure comprising four or more layers, or wherein a protective film having a multilayer structure comprising three or more layers is provided on the organic photoelectric conversion film.

11 Claims, 2 Drawing Sheets

ORGANIC AND INORGANIC HYBRID PHOTOELECTRIC CONVERSION DEVICE

BACKGROUND OF THE INVENTION

1. Field of the Invention

The present invention relates to a photoelectric conversion device containing an inorganic photoelectric conversion film having stacked thereon an organic photoelectric conversion film, and an imaging device containing the photoelectric conversion device.

2. Description of the Related Art

An imaging system using a silver salt photosensitive material, which is represented by a color negative photosensitive material and a color reversal photosensitive material, and a camera is being replaced by a digital camera using a solid imaging system, such as CCD and CMOS, owing to the convenience thereof. However, in a system having a three-color mosaic filter applied to a single-plate sensor used in the current solid imaging system, a high resolution cannot be obtained since one pixel of the light receiving device corresponds to one of blue light, green light and red light. Paying attention to a unit pixel, incident light having a wavelength outside the range of the desired color is absorbed by the color filter and is not effectively utilized, which brings about drawbacks in image quality as compared to the imaging system using a silver salt photosensitive material and a camera. Furthermore, since blue light, green light and red light are detected at different positions, color separation occurs to cause false color in some cases, and thus an optical low-pass filter is necessarily used to cause light loss.

In order to eliminate the problems, such a solid imaging system has been developed that blue light, green light and red light are detected at the same position with separation in the depth direction of silicon (as described, for example, in JP-A-2002-513145).

In order to improve the color reproducibility, furthermore, such an imaging device is also disclosed that has a first light receiving part detecting light having a first wavelength range and a second light receiving part detecting light having a second wavelength range, in which at least a part of incident light is received by the second light receiving part after passing through the first light receiving part (as described, for example, in JP-A-2003-332551).

However, these systems are still insufficient in studies on color reproducibility, resolution and SN ratio, and are inferior to the imaging system using a silver salt photosensitive material and a camera.

SUMMARY OF THE INVENTION

An object of the invention is to provide an imaging sensor improved in color reproducibility and SN ratio equivalent to an imaging system using a silver salt photosensitive material and a camera.

The inventors have found that the color reproducibility and the SN ratio, and furthermore the time lapse stability and the process durability upon microfabrication can be improved in such a manner that: an insulating film intervening between an inorganic photoelectric conversion film and an organic photoelectric conversion film is reduced in thickness to a certain value or less; an organic photoelectric conversion film has a multilayer structure containing four or more layers; or a protective layer having a multilayer structure containing three or more layers is formed on an organic photoelectric conversion film. Accordingly, the invention relates to the following constitutions (1) to (23).

(1) A photoelectric conversion device comprising:
an inorganic photoelectric conversion film;
an insulating film; and
an organic photoelectric conversion film, in this order,
wherein the insulating film has a thickness of from 1 to 6 µm.

(2) The photoelectric conversion device as described in (1) above,
wherein the inorganic photoelectric conversion film performs photoelectric conversion of at least blue light and red light, and
wherein the organic photoelectric conversion film performs photoelectric conversion of at least green light.

(3) The photoelectric conversion device as described in (2) above,
wherein the inorganic photoelectric conversion film comprises a silicon semiconductor, and the inorganic photoelectric conversion film performs photoelectric conversion of at least blue light and red light separately in a depth direction of the silicon semiconductor.

(4) The photoelectric conversion device as described in (2) or (3) above,
wherein the organic photoelectric conversion film performing photoelectric conversion of green light has a maximum absorption wavelength of from 510 to 560 nm, a maximum absorptivity of from 80 to 100% and a half value width of absorptivity of from 50 to 100 nm.

(5) The photoelectric conversion device as described in any of (2) to (4) above,
wherein a number of pixels for green light is larger than a number of pixels for blue light or red light.

(6) A photoelectric conversion device comprising:
an inorganic photoelectric conversion film; and
an organic photoelectric conversion film directly or indirectly stacked on the inorganic photoelectric conversion film,
wherein the organic photoelectric conversion film has a multilayer structure comprising four or more layers.

(7) The photoelectric conversion device as described in (6) above,
wherein the organic photoelectric conversion film comprises at least a positive hole blocking organic material layer, an n-type organic material layer, a p-type organic material layer and an electron blocking organic material layer.

(8) The photoelectric conversion device as described in (6) above,
wherein the organic photoelectric conversion film comprises at least a positive hole blocking organic material layer, an n-type organic material layer, a pn-type mixed organic material layer, a p-type organic material layer and an electron blocking organic material layer.

(9) The photoelectric conversion device as described in any of (1) and (6) to (8) above, which further comprises two transparent electroconductive films,
wherein the organic photoelectric conversion film is held between the two transparent electroconductive films.

(10) The photoelectric conversion device as described in (9) above,
wherein at least one of the two transparent electroconductive films has a thickness of from 5 to 50 nm.

(11) The photoelectric conversion device as described in (9) or (10) above, which further comprises a protective film having a multilayer structure comprising three or more layers directly or indirectly on one of the two transparent electroconductive films farther from the inorganic photoelectric conversion film.

(12) The photoelectric conversion device as described in any of (9) to (11) above, wherein one of the two transparent electroconductive films nearer the inorganic photoelectric conversion film forms a pixel electrode.

(13) The photoelectric conversion device as described in any of (9) to (12) above,
wherein one of the two transparent electroconductive films farther from the inorganic photoelectric conversion film forms a common electrode.

(14) The photoelectric conversion device as described in any of (1) to (13) above,
wherein the organic photoelectric conversion film is formed continuously without separation for each pixel.

(15) The photoelectric conversion device as described in any of (1) to (14) above,
wherein the organic photoelectric conversion film has a surface smoothness that is 1/10 or less of a thickness of the organic photoelectric conversion film.

(16) A photoelectric conversion device comprising:
an inorganic photoelectric conversion film;
an organic photoelectric conversion film; and
a protective film having a multilayer structure comprising three or more layers, in this order.

(17) The photoelectric conversion device as described in (9) or (16) above,
wherein the protective film has a total thickness of from 1 to 10 μm.

(18) The photoelectric conversion device as described in any of (11) and (16) to (17) above, which further comprises at least one film selected from an antireflection film, an infrared ray shielding film and an ultraviolet ray shielding film directly or indirectly on the protective film.

(19) The photoelectric conversion device as described in any of (1) to (18) above, which further comprises at least one color reproduction compensating layer at least one of above and under the organic photoelectric conversion film.

(20) The photoelectric conversion device as described in any of (1) to (19) above, which further comprises a signal readout section having a MOS structure.

(21) The photoelectric conversion device as described in (20) above,
wherein the signal readout section utilizes an electron as a readout signal.

(22) The photoelectric conversion device as described in (20) above,
wherein the signal readout section utilizes a positive hole as a readout signal.

(23) An imaging device comprising a photoelectric conversion device as described in any of (1) to (22) above.

DETAILED DESCRIPTION OF THE INVENTION

The photoelectric conversion device according to the invention will be described with reference to FIG. 1.

Figure 1:
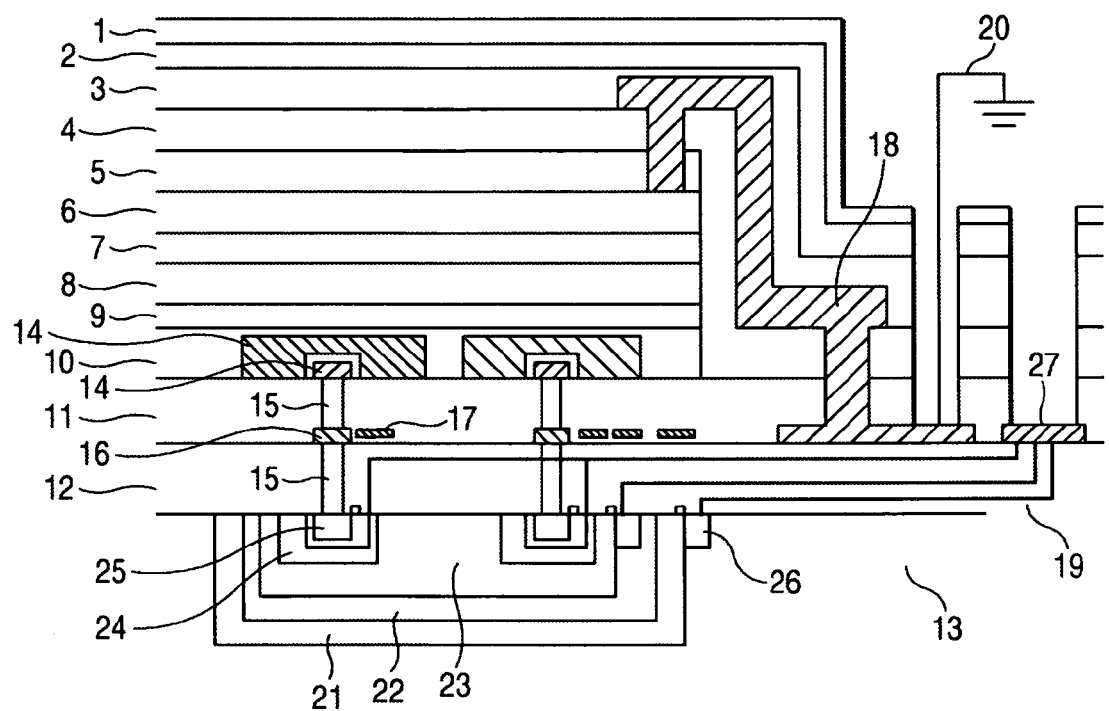
FIG. 1 is a schematic illustration showing a preferred embodiment of the photoelectric conversion device according to the invention.

FIG. 1 is a schematic illustration showing a preferred embodiment of the photoelectric conversion device according to the invention, in which an inorganic photoelectric conversion film 13 (21 to 23) having formed thereon an organic photoelectric conversion film 7, 8, 9 and 10 to fabricate the photoelectric conversion device.

It is preferred that the inorganic photoelectric conversion film 13 (21 to 23) performs photoelectric conversion of blue light and red light, and the organic photoelectric conversion film 7, 8, 9 and 10 performs photoelectric conversion of green light. It is particularly preferred that the inorganic photoelectric conversion film 13 (21 to 23) is formed of a silicon semiconductor and performs photoelectric conversion of at least blue light and red light separately in a depth direction of the silicon semiconductor. For example, the inorganic photoelectric conversion film 13 is a silicon p-type substrate having an n-type well 21, a p-type well 22 and an n-type well 23. The photoelectric conversion is performed by the respective pn-junctions, the n-type well 23 collects blue light signals, and the n-type well 21 collects red light signals. The separation of colors in the depth direction utilizing the difference in absorption coefficient of silicon is disclosed in a known literature. The signals can be read out from a pad 27 through a signal wiring 19. The inorganic photoelectric conversion film is preferably a silicon semiconductor having a CMOS structure, in which numerals 25 and 26 denote a readout switch for electric signals and a transistor performing amplification, respectively. A horizontal shift resister, a vertical shift resister and a noise suppressing circuit relating to the readout of signals are omitted in the figure. The organic photoelectric conversion film absorbs green light, whereby the separation of blue light and red light by the inorganic photoelectric conversion film is facilitated. The organic photoelectric conversion film preferably has a maximum absorption wavelength of from 510 to 560 nm, and more preferably from 520 to 550 nm. The term maximum absorption wavelength referred herein means an absorption wavelength exhibiting the highest light absorptivity. The absorptivity at the maximum absorption wavelength, i.e., the maximum absorptivity, is preferably from 80 to 100%, and more preferably from 90 to 100%. The half value width of absorptivity is preferably from 50 to 100 nm, and more preferably from 60 to 90 nm. The half value width of absorptivity referred herein means the width of the absorption wavelength at an absorptivity of half of the maximum absorptivity.

While not shown in the figure, it is preferred that a color reproduction compensating layer is provided above and/or under the organic photoelectric conversion film performing photoelectric conversion of green light. For example, it is preferred that a color reproduction compensating layer of magenta color is provided under the organic photoelectric conversion film for preventing green light passing through the organic photoelectric conversion film from reaching the inorganic photoelectric conversion film. In order to control light absorption and to improve color separation in the organic photoelectric conversion film, it is preferred that a color reproduction compensating layer having absorption in the vicinity of a range of from 480 to 500 nm and/or the vicinity of a range of from 580 to 600 nm is provided above the organic photoelectric conversion film. The color reproduction compensating layer may be appropriately selected corresponding to purposes depending on the spectrum shape of light absorption and the absolute value of light absorption of the organic photoelectric conversion film, the spectrum shapes of light absorption and the absolute values of light absorption of blue light and red light of the inorganic photoelectric conversion film, and the method of signal processing.

In the invention, insulating film 11 and 12 preferably has a thickness of from 1 to 6 μm. More specifically, the thickness of the insulating film means the distance from the lower end of the organic photoelectric conversion film to the diode upper end of the inorganic photoelectric conversion film.

The insulating film is inserted between the inorganic photoelectric conversion film and the organic photoelectric conversion film for preventing them from being in electric contact with each other. One of the characteristic features of the invention is that the thickness of the insulating film is 6 µm or less, which is thinner than a conventional constitution. In the case where the thickness of the insulating film is too large, it is not preferred since the signal from the organic photoelectric conversion film and the signal from the inorganic photoelectric conversion film are deviated from each other in position of the pixel of the photoelectric conversion device, and in the case where the thickness of the insulating film is too small, it is also not preferred since a signal wiring 19 and the like cannot be provided in the insulating film. The thickness of the insulating film is more preferably from 2 to 5 µm. The insulating layer in the figure is constituted by two layers 11 and 12, and a three-layer, four-layer or five-layer structure or more is preferably employed depending on the design of the signal wiring. The thickness of the insulating film is set to the value defined in the invention, whereby high image quality can be attained without false color and color blur.

In FIG. 1, the organic photoelectric conversion film has the four-layer structure 7, 8, 9 and 10, and in the invention, the organic photoelectric conversion film preferably has a multilayer structure containing four or more layers, and is preferably held between two transparent electroconductive films 6 and 14. It is more preferred that the transparent electroconductive film 14 nearer the inorganic photoelectric conversion film forms a pixel electrode. It is preferred from the standpoint of film forming process that the transparent electroconductive film 6 farther from the inorganic photoelectric conversion film forms a common electrode. It is also preferred from the standpoint of film forming process that the organic photoelectric conversion film is formed continuously without separation for each pixel. With respect to the organic photoelectric conversion film and layers above the organic photoelectric conversion film, pixel separation is preferably attained only in the lower electrode since it is basically necessary that the organic photoelectric conversion film is prevented from suffering from damages on process as much as possible.

The photoelectric conversion efficiency is improved by applying an appropriate bias to the organic photoelectric conversion film, but the S/N ratio is rather deteriorated due to increase of the leakage electric current from the electrode. In the invention, it has been found that the problem can be eliminated by using an organic photoelectric conversion film having a multilayer structure containing four or more layers. In the case where the transparent electroconductive film 6 as an upper electrode is applied with voltage relatively negatively, and the transparent electroconductive film 14 as a pixel electrode is applied with voltage relatively positively, an organic material suitable for an electron blocking layer is selected for the layer 7, and an organic material suitable for a positive hole blocking layer is selected for the layer 10, in the organic photoelectric conversion film 7, 8, 9 and 10. According to the constitution, the increase in dark electric current by application of voltage can be suppressed. Furthermore, a p-type organic material is selected for the layer 8, and an n-type organic material is selected for the layer 9, whereby the photoelectric conversion efficiency can be improved. Moreover, a pn-type mixed organic material layer, an i-type layer, an electron transporting layer and a positive hole transporting layer are provided to form a multilayer constitution containing four or more layers for the organic photoelectric conversion film, whereby the S/N ratio can be further improved. According to the constitution, a photoelectric conversion device containing an inorganic photoelectric conversion film having stacked thereon an organic photoelectric conversion film can be realized.

In the invention, it has been found that the capability of the organic photoelectric conversion film can be improved when the thickness of the transparent electroconductive film is from 5 to 50 nm. In the case where the transparent electroconductive film is too thin, the voltage cannot be uniformly applied, and in the case where it is too thick, the yield ratio is lowered due to short circuit, which may be caused by damages on forming the transparent electroconductive film. In the invention, the thickness of the transparent electroconductive film is preferably from 10 to 40 nm. By reducing the thickness of the transparent electroconductive film 14 as the pixel electrode, the surface smoothness of the organic photoelectric conversion film can be $1/10$ or less of the thickness of the organic photoelectric conversion film. The surface smoothness is defined as RMS of the height distribution with respect to the horizontal plane of the organic photoelectric conversion film 7. By embedding the pixel electrode 14 in the insulating film 11, the surface smoothness can be further improved. It is particularly preferred that the surface smoothness of the organic photoelectric conversion film is $1/20$ or less of the thickness of the organic photoelectric conversion film.

The signals of the organic photoelectric conversion film are preferably accumulated from the pixel electrode 14 into the n-type well inside the p-type well 24 of the silicon substrate through a via plug 15 and a via metal 16 in the insulating film, and read out to the outside 27 through the transistor 25 via the wiring 19. The via plug and the via metal are increased when the insulating film has a multilayer structure. Numeral 17 denotes a light shielding film for preventing the transistor from being irradiated with light.

In the invention, it is preferred that a protective film 3, 4 and 5 having a multilayer structure containing three or more layers is provided on the organic photoelectric conversion film. It is particularly preferred that the protective film is formed on the transparent electroconductive films (particularly, the common electrode) holding the organic photoelectric conversion film. Numeral 18 denotes a wiring for applying a voltage to the transparent electrode 6, which is grounded with a wiring 20 in this embodiment. As having been described, the peripheral circuits are omitted in the figure. It has been found from the investigations on production process of the photoelectric conversion device that the multilayer structure containing three or more layers is necessary for the protective layer in order to protect the side surface of the organic photoelectric conversion film firmly and to connect electrically with the transparent electroconductive film 6. The protective layer preferably has a multilayer structure containing four or more layers, and the total thickness of the protective layer is particularly preferably from 1 to 10 µm. In the case where the thickness of the protective layer is in the range, both the optical characteristics of the photoelectric conversion device and the time lapse storage stability, which has been often a problem in organic materials, can be simultaneously attained. The thickness of the protective layer is particularly preferably from 2 to 9 µm. In the invention, it is effective to reduce the thickness of the transparent electroconductive film as having been described, and therefore, in the case where the transparent electroconductive film has a thickness in the aforementioned preferred range, the protective film having a multilayer structure containing three or more layers is particularly important for protecting the organic photoelectric conversion film from damages of various processes.

In the invention, it is preferred that the photoelectric conversion device has at least one film selected from an antireflection film, an infrared ray shielding film and an ultraviolet ray shielding film on the protective film, and two or all of these layers may be used in combination depending on necessity. In FIG. 1, these layers are simply denoted by numerals 1 and 2.

In the invention, it is preferred that the number of pixels 14 for green light is larger than the number of pixels 23 and 21 for blue light or red light. In the embodiment shown in FIG. 1, the number of pixels for green light is twice the number of pixels for blue light and red light. Since human eye is high in visibility to green light, relative increase of pixels for green light is considerably effective for improving the image quality. The reduction in pixel area of the photoelectric conversion parts for blue light and red light can be compensated by the transistor.

The photoelectric conversion device of the invention will be described in more detail.

The photoelectric conversion device contains an electromagnetic wave absorbing/photoelectric conversion part and a charge accumulation/transfer/readout part for charge generated through photoelectric conversion.

The electromagnetic wave absorbing/photoelectric conversion part has a stacked layer structure containing at least two layers capable of absorbing and photoelectrically conversing blue light, green light and red light. The blue light absorbing layer (B) can absorb at least light having a wavelength of from 400 to 500 nm, and the absorptivity thereof at the peak wavelength is preferably 50% or more. The green light absorbing layer (G) can absorb at least light having a wavelength of from 500 to 600 nm, and the absorptivity thereof at the peak wavelength is preferably 50% or more. The red light absorbing layer (R) can absorb at least light having a wavelength of from 600 to 700 nm, and the absorptivity thereof at the peak wavelength is preferably 50% or more. The order of these layers is not limited, and examples of the order in the three-layer stacked structure include BGR, BRG, GBR, GRB, RBG and RGB from the above. It is preferred that the G layer is the uppermost layer as having been described. In the case of the two-layer stacked structure, the BG layer is formed on the same plane under the R layer as the upper layer, the GR layer is formed on the same plane under the B layer as the upper layer, or the BR layer is formed on the same plane under the G layer as the upper layer. It is preferred that the BR layer is formed on the same plane under the G layer as the upper layer. In the case where the layer absorbing light of two colors is provided in the same plane as the lower layer, it is preferred that a filter layer capable of separating colors is provided, for example, in a mosaic form, on the upper layer or between the upper layer and the lower layer. In some cases, the fourth or more layers may be provided as a separate layer or in the same plane.

The charge accumulation/transfer/readout part is provided under the electromagnetic wave absorbing/photoelectric conversion part. It is preferred that the electromagnetic wave absorbing/photoelectric conversion part also functions as the charge accumulation/transfer/readout part.

In the invention, the photoelectric conversion device contains an inorganic layer having stacked thereon an organic layer. In this case, when the organic layer contains one layer, the inorganic layer basically contains one layer or two layers, and when the organic layer contains two layers, the inorganic layer basically contains one layer. In the case where the organic layer and the inorganic layer are one layer each, the inorganic layer forms electromagnetic wave absorbing/photoelectric conversion parts for two or more colors in the same plane. It is preferred that the organic layer as the upper layer is the G layer, and the inorganic layer as the lower layer contains the B layer and the R layer in this order from the above. In some cases, the fourth or more layers may be provided as a separate layer or in the same plane. In the case where an inorganic layer is used as the electromagnetic wave absorbing/photoelectric conversion part, it is preferred that the electromagnetic wave absorbing/photoelectric conversion part also functions as the charge accumulation/transfer/readout part.

The organic layer as the organic photoelectric conversion layer of the invention will be described.

The organic layer as the organic photoelectric conversion film is formed by accumulation or mixture of a section absorbing electromagnetic wave, a photoelectric conversion section, an electron transporting section, a positive hole transporting section, an electron blocking section, a positive hole blocking section, a crystallization preventing section, an electrode and an interlayer contact improving section. The organic layer preferably contains a p-type organic compound or an n-type organic compound.

The p-type organic semiconductor (compound) is a donative organic semiconductor (compound) represented by a positive hole transporting organic compound, and designates an organic compound having an electron donative property. More specifically, one of two organic compounds having a smaller ionization potential upon making the two compounds in contact with each other. Therefore, the donative organic compound may be any organic compound having an electron donative property. Examples thereof include a triarylamine compound, a benzidine compound, a pyrazoline compound, a styrylamine compound, a hydrazone compound, a triphenylmethane compound, a carbazole compound, a polysilane compound a thiophene compound, a phthalocyanine compound, a cyanine compound, a merocyanine compound, an oxonol compound, a polyamine compound, an indole compound, a pyrrole compound, a pyrazole compound, a polyarylene compound, a condensed aromatic carbocyclic compound (such as a naphthalene derivative, an anthracene derivative, a phenanthrene derivative, a tetracene derivative, a pyrene derivative, a perylene derivative and a foluorantene derivative), and a metallic complex having a nitrogen-containing heterocyclic compound as a ligand. Additionally, an organic compound that has a smaller ionization potential than an organic compound used as an n-type (acceptive) compound may be used as the donative organic semiconductor.

The organic n-type semiconductor (compound) is an acceptive organic semiconductor (compound) represented by an electron transporting organic compound, and designates an organic compound having an electron acceptive property. More specifically, one of two organic compounds having a larger electron affinity upon making the two compounds in contact with each other. Therefore, the acceptive organic compound may be any organic compound having an electron acceptive property. Examples thereof include a condensed aromatic carbocyclic compound (such as a naphthalene derivative, an anthracene derivative, a phenanthrene derivative, a tetracene derivative, a pyrene derivative, a perylene derivative and a foluorantene derivative), a 5- to 7-membered heterocyclic compound containing a nitrogen atom, an oxygen atom or a sulfur atom (such as pyridine, pyrazine, pyrimidine, pyridazine, triazine, quinoline, quinoxaline, quinazoline, phthalazine, cinnoline, isoquinoline, pteridine, acridine, phenazine, phenanthrene, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyridine, pyrrolopyridine, thiaziazolopyridine, dibenzazepine and tribenzazepine), a polyarylene compound, a fluorene compound, a cyclopentadiene compound, a silyl compound, and a metallic complex having a nitrogen-containing heterocyclic compound as a ligand. Additionally, an organic compound that has a larger electron affinity than an organic compound used as the donative organic compound may be used as the acceptive organic semiconductor.

The p-type organic colorant and the n-type organic colorant may be any compound, and preferred examples thereof include a cyanine colorant, a styryl colorant, a hemicyanine colorant, a merocyanine colorant (including zeromethine merocyanine (simple merocyanine)), a three-nucleus merocyanine colorant, a four-nucleus merocyanine colorant, a rhodacyanine colorant, a complex cyanine colorant, a complex merocyanine colorant, an allopolar colorant, an oxonol colorant, a hemioxonol colorant, a squalirium colorant, a croconium colorant, an azamethine colorant, a coumarin colorant, an arylidene colorant, an anthraquinone colorant, a triphenylmethane colorant, an azo colorant, an azomethine colorant, a spyro compound, a metallocene colorant, a fluorenone colorant, a fulgide colorant, a perylene colorant, a phenazine colorant, a phenothiazine colorant, a quinone colorant, an indigo colorant, a diphenylmethane colorant, a polyene colorant, an acrydine colorant, an acrydinone colorant, a diphenylamine colorant, a quinacridone colorant, a quinophthalone colorant, a phenoxazine colorant, a phthaloperylene colorant, a porphyrin colorant, a chlorophyll colorant, a phthalocyanine colorant, a metallic complex colorant, and a condensed aromatic carbocyclic colorant (such as a naphthalene derivative, an anthracene derivative, a phenanthrene derivative, a tetracene derivative, a pyrene derivative, a perylene derivative and a foluorantene derivative).

The metallic complex compound will be described. The metallic complex compound is a metallic complex having at least one ligand containing a nitrogen atom, an oxygen atom or a sulfur atom coordinate to a metal. The metallic ion contained in the metallic complex is not particularly limited, and preferred examples thereof include a beryllium ion, a magnesium ion, an aluminum ion, a gallium ion, a zinc ion, an indium ion and a tin ion, more preferably a beryllium ion, an aluminum ion, a gallium ion and a zinc ion, and further preferably an aluminum ion and a zinc ion. The ligand contained in the metallic complex may be selected from various know ligands, and examples thereof include ligands disclosed in H. Yersin, "Photochemistry and Photophysics of Coordination Compounds", Springer-Verlag AG (1987), and A. Yamamoto, "Yuki Kinzoku Kagaku (Kiso to Oyo)" (Organic Metal Chemistry (Fundamentals and Applications)), Shokabo Publishing Co., Ltd. (1982).

Preferred examples of the ligand include a nitrogen-containing heterocyclic ligand (preferably having from 1 to 30 carbon atoms, more preferably from 2 to 20 carbon atoms, and particularly preferably from 3 to 15 carbon atoms, which may be a unidentate ligand or a bidentate ligand, and preferably a bidentate ligand, such as a pyridine ligand, a bipyridyl ligand, a quinolinol ligand, and a hydroxyphenylazole ligand (e.g., a hydroxyphenylbenzimidazole ligand, a hydroxyphenylbenzoxazole ligand and a hydroxyphenylimidazole ligand))), an aloxy ligand (preferably having from 1 to 30 carbon atoms, more preferably from 1 to 20 carbon atoms, and further preferably from 1 to 10 carbon atoms, such as methoxy, ethoxy, butoxy and 2-ethylhexyloxy), an aryloxy ligand (preferably having from 6 to 30 carbon atoms, more preferably from 6 to 20 carbon atoms, and further preferably from 6 to 12 carbon atoms, such as phenyloxy, 1-naphthyloxy, 2-naphthyloxy, 2,4,6-trimethylphenyloxy and 4-biphenyloxy), a heteroaryloxy ligand (preferably having from 1 to 30 carbon atoms, more preferably from 1 to 20 carbon atoms, and further preferably from 1 to 12 carbon atoms, such a pyridyloxy, pyrazyloxy, pyrimidyloxy and quinolyloxy), an alkylthio ligand (preferably having from 1 to 30 carbon atoms, more preferably from 1 to 20 carbon atoms, and further preferably from 1 to 12 carbon atoms, such as methylthio and ethylthio), an arylthio ligand (preferably having from 6 to 30 carbon atoms, more preferably from 6 to 20 carbon atoms, and further preferably having from 6 to 12 carbon atoms, such as phenylthio), a heterocyclic ring-substituted thio ligand (preferably having from 1 to 30 carbon atoms, more preferably from 1 to 20 carbon atoms, and further preferably from 1 to 12 carbon atoms, such as pyridylthio, 2-benzylmidazolylthio, 2-benzoxazolylthio and 2-benzthiazolylthio), and a siloxy ligand (preferably having from 1 to 30 carbon atoms, more preferably from 3 to 25 carbon atoms, and particularly preferably from 6 to 20 carbon atoms, such as a triphenylsiloxy group, a triethoxysiloxy group and a triisopropylsiloxy group), more preferably a nitrogen-containing heterocyclic ligand, an aryloxy ligand, a heteroaryloxy group and a siloxy ligand, and further preferably a nitrogen-containing heterocyclic ligand, an aryloxy ligand and a siloxy ligand.

In the invention, the photoelectric conversion device preferably has, between a pair of electrodes, such a photoelectric conversion film (photosensitive layer) that has a p-type semiconductor layer and an n-type semiconductor layer, at least one of which is an organic semiconductor, and has, as an intermediate layer between the semiconductor layers, a bulk hetero junction structure layer containing the p-type semiconductor and the n-type semiconductor. In this case, the organic layer contains the bulk hetero junction structure in the photoelectric conversion film, whereby the defect due to the short carrier diffusion length in the organic layer is compensated to improve the photoelectric conversion efficiency. The bulk hetero junction structure is described in detail in Japanese Patent Application No. 2004-080639.

In the invention, it is preferred that the device contains a photoelectric conversion film (photosensitive layer) having a structure containing two or more repeating structures (tandem structures) of a pn-junction layer formed of a p-type semiconductor layer and an n-type semiconductor layer between a pair of electrodes, and it is more preferred that a thin layer of an electroconductive layer is inserted between the repeating structures. The number of the repeating structures (tandem structures) of the pn-junction layer is not particularly limited, and is preferably from 2 to 50, more preferably from 2 to 30, and particularly preferably from 2 or 10, for improving the photoelectric conversion efficiency. Preferred examples of the electroconductive material include silver and gold, and silver is most preferred. The tandem structure is described in detail in Japanese Patent Application No. 2004-079930.

In the photoelectric conversion film containing a p-type semiconductor layer and an n-type semiconductor layer (preferably a mixed and dispersed layer (bulk hetero junction layer) between a pair of electrodes), it is preferred that at least one of the p-type semiconductor and the n-type semiconductor contains an organic compound controlled in orientation, and it is more preferred that both the p-type semiconductor and the n-type semiconductor contain an organic compound controlled (or capable of being controlled) in orientation. Preferred examples of the organic compound used in the organic layer of the photoelectric conversion film include a compound having a π-conjugate electron, and it is preferred that the π-electron plane is not perpendicular to the substrate (electrode substrate) but is inclined at an angle close to the parallel direction. The angle with respect to the substrate is preferably from 0 to 80°, more preferably from 0 to 60°, further preferably from 0 to 40°, still further preferably from 0 to 20°, particularly preferably from 0 to 100, and most preferably 0° (i.e., in parallel to the substrate). The layer of the organic compound controlled in orientation occupies at least a part of the entire organic layer, and it is preferred that the part having been controlled in orientation is in a proportion of 10% or more, more preferably 30% or more, further preferably 50% or more, still further preferably 70% or more, particularly preferably 90% or more, and most preferably 100%, based on the entire organic layer. In the aforementioned constitution, the organic compound in the organic layer is controlled in orientation in the photoelectric conversion film, whereby the defect due to the short carrier diffusion length in the organic layer is compensated to improve the photoelectric conversion efficiency.

In the case where the organic compound is controlled in orientation, it is preferred that the hetero junction plane (such as the pn-junction plane) is not in parallel to the substrate. The hetero junction plane is preferably not in parallel to the substrate (electrode substrate) and is preferably oriented in an angle close to the perpendicular as much as possible. The angle with respect to the substrate is preferably from 10 to 90°, more preferably from 30 to 90°, further preferably from 50 to 90°, still further preferably from 70 to 90°, particularly preferably from 80 to 90°, and most preferably 90° (i.e., perpendicular to the substrate). It is sufficient that the layer of the organic compound controlled in hetero junction plane is contained at least a part of the entire organic layer. The proportion of the part controlled in orientation is preferably 10% or more, more preferably 30% or more, further preferably 50% or more, still further preferably 70% or more, particularly preferably 90% or more, and most preferably 100%, based on the entire organic layer. According to the constitution, the area of the hetero junction plane in the organic layer is increased to increase the amounts of carriers, such as electrons, positive holes and pairs of an electron and a positive hole, whereby the photoelectric conversion efficiency is improved. In particular, the photoelectric conversion efficiency can be improved in the photoelectric conversion film having been controlled in both hetero junction plane and π-electron plane of the organic compound. The constitutions are described in detail in Japanese Patent Application No. 2004-079931.

In view of light absorption, the thickness of the organic colorant layer is preferably as large as possible, but in consideration of a part that does not contribute to charge separation, the thickness of the organic colorant layer in the invention is preferably from 30 to 300 nm, more preferably from 50 to 250 nm, and particularly preferably from 80 to 200 nm.

The layer containing the organic compound may be formed by a dry film forming method or a wet film forming method. Specific examples of the dry film forming method include a physical vapor phase growing method, such as a vacuum deposition method, a sputtering method, an ion plating method and an MBE method, and a CVD method, such as a plasma polymerization method. Examples of the wet film forming method include a casting method, a spin coating method, a dipping method and an LB method.

In the case where a polymer compound is used as at least one of the p-type semiconductor (compound) and the n-type semiconductor (compound), it is preferably formed by a wet film forming method for facilitating production. In the case where the dry film forming method, such as vapor deposition, is employed, it is difficult to perform since a polymer is liable to be decomposed, and an oligomer may be used instead. In the case where a low molecular weight compound is used in the invention, on the other hand, the dry film forming method is preferably employed, and in particular a vacuum deposition method is preferably employed. The vacuum deposition method includes such basic parameters as the method of heating a compound, e.g., a resistance heating vapor deposition method and an electron beam heating vapor deposition method, the shape of a vapor deposition source, e.g., a crucible and a boat, the degree of vacuum, the vapor deposition temperature, the substrate temperature, and the vapor deposition rate. In order to perform uniform vapor deposition, it is preferred that vapor deposition is performed while the substrate is rotated. The degree of vacuum is preferably as high as possible, and the vapor deposition is preferably carried out at a pressure of $10^{-4}$ Torr or less, more preferably $10^{-6}$ Torr or less, and particularly preferably $10^{-8}$ Torr or less. All the process steps in the vapor deposition are preferably carried out in vacuum, in which the compounds are basically prevented from being in direct contact with oxygen and water in the exterior. The aforementioned parameters in vapor deposition have influence on the crystallinity, the amorphous property, the density and the compactness of the organic film, and thus they are necessarily controlled precisely. The vapor deposition rate is preferably subjected to PI control or PID control by using a quartz oscillator and a thickness monitor, such as an interferometer. In the case where two or more kinds of compounds are vapor-deposited simultaneously, a co-vapor deposition method and a flash vapor deposition method are preferably employed.

It is preferred that the organic photoelectric conversion film of the invention is held by a pair of electrodes, which form a pixel electrode and a counter electrode, respectively. It is preferred that the lower electrode forms a pixel electrode.

The counter electrode preferably takes out a positive hole from a positive hole transporting photoelectric conversion film or a positive hole transporting layer, and is formed of such a material as a metal, an alloy, a metallic oxide, an electroconductive compound and a mixture thereof. The pixel electrode preferably takes out an electron from an electron transporting photoelectric conversion layer or an electron transporting layer, and is selected in consideration of the adhesion property to the adjacent layer, such as an electron transporting photoelectric conversion layer and an electron transporting layer, the electron affinity, the ionization potential, and the stability. Specific examples of the electrodes include an electroconductive metallic oxide, such as tin oxide, zinc oxide, indium oxide, indium tin oxide (ITO) and indium zinc oxide (IZO), a metal, such as gold, silver, chromium and nickel, a mixture or an stacked material of the metal and the electroconductive metallic oxide, an inorganic electroconductive substance, such as copper iodide and copper sulfide, an organic electroconductive material, such as polyaniline, polythiophene and polypyrrole, a silicon compound, and an stacked product of at least one of these materials with ITO, and preferably an electroconductive metallic oxide, with ITO and IZO being particularly preferred from the standpoint of productivity, high electroconductivity and transparency.

The pixel electrode and the counter electrode may be produced by various methods depending on the material therefor, and an electrode of ITO may be produced, for example, by an electron beam method, a sputtering method, a resistance heating vapor deposition method, a chemical reaction method (such as a sol-gel method) or a method of coating an indium tin oxide dispersion. An electrode formed of ITO may be subjected to an UV treatment, an ozone treatment or a plasma treatment.

In the invention, the transparent electrode film is preferably produced under conditions free of plasma. By producing the transparent electrode film under conditions free of plasma, the influence of plasma on the substrate can be reduced to improve the photoelectric conversion characteristics. The conditions free of plasma herein means that no plasma is generated during the production of the film, or the distance between the plasma generation source to the substrate during the production of the film is 2 cm or more, preferably 10 cm or more, and more preferably 20 cm or more, so as to reduce the amount of plasma reaching the substrate.

Examples of an apparatus where no plasma is generated during the production of transparent electrode film include an electron beam vapor deposition apparatus (EB vapor deposition apparatus) and a pulse laser vapor deposition apparatus. Examples of the EB vapor deposition apparatus and the pulse laser vapor deposition apparatus include those described in Y. Sawada, "Toumei Douden Maku no Shintenkai" (New Developments of Transparent Electroconductive Films), CMC Press (1999), Y. Sawada, "Toumei Douden Maku no Shintenkai II" (New Developments of Transparent Electroconductive Films II), CMC Press (2002), Japan Society for the Promotion of Science, "Toumei Douden Maku no Gijutu" (Techniques of Transparent Electroconductive Films), Ohmsha Co., Ltd. (1999), and the apparatuses cited in the references of these literatures. In the following description, a method for producing the transparent electrode film by using an EB vapor deposition apparatus is referred to as an EB vapor deposition method, and a method for producing the transparent electrode film by using a pulse laser vapor deposition apparatus is referred to as a pulse laser vapor deposition method.

An apparatus capable of realizing such conditions where the distance between a plasma generation source to the substrate is 2 cm or more to reduce the amount of plasma reaching the substrate (which is hereinafter referred to as a plasma free film forming apparatus) includes, for example, a counter target sputtering apparatus and an arc plasma vapor deposition method, examples of which include apparatuses disclosed in Y. Sawada, "Toumei Douden Maku no Shintenkai" (New Developments of Transparent Electroconductive Films), CMC Press (1999), Y. Sawada, "Toumei Douden Maku no Shintenkai II" (New Developments of Transparent Electroconductive Films II), CMC Press (2002), Japan Society for the Promotion of Science, "Toumei Douden Maku no Gijutu" (Techniques of Transparent Electroconductive Films), Ohmsha Co., Ltd. (1999), and the apparatuses cited in the references of these literatures.

The electrode of the organic electromagnetic wave absorbing/photoelectric conversion part will be described in more detail. The photoelectric conversion film of the organic layer is held between the pixel electrode film and the counter electrode film and may contain an interelectrode material. The pixel electrode film is an electrode film formed above the substrate in an area where the charge accumulation/transfer/readout part is formed, and is generally separated to each pixel. This is because the signal charge thus converted by the photoelectric conversion film is read out per one pixel on the substrate of the charge accumulation/transfer/readout part to obtain an image.

The counter electrode film has such a function that discharges a signal charge having the opposite polarity to the converted signal charge by holding the photoelectric conversion film with the pixel electrode film. The discharge of the signal charge may not be separated to each pixel, and therefor, the counter electrode film is generally common to all the pixels. Therefore, the counter electrode film is sometimes referred to as a common electrode film.

The photoelectric conversion film is positioned between the pixel electrode film and the counter electrode film. The photoelectric conversion function is exerted with the photoelectric conversion film with the pixel electrode film and the counter electrode film.

Examples of the constitution of the photoelectric conversion stacked layer include, in the case where only one organic layer is stacked on a substrate, such a structure that contains a substrate having stacked in this order a pixel electrode film (which is generally a transparent electrode film), a photoelectric conversion film, and a counter electrode film (which is a transparent electrode film), but the invention is not limited to the constitution.

In the case where two organic layer are stacked on a substrate, examples of the constitution include such a structure that contains a substrate having stacked in this order a pixel electrode film (which is generally a transparent electrode film), a photoelectric conversion film, a counter electrode film (which is a transparent electrode film), an interlayer insulating film, a pixel electrode film (which is generally a transparent electrode film), a photoelectric conversion film, and a counter electrode film (which is a transparent electrode film).

The material for the transparent electrode film constituting the photoelectric conversion part is preferably a material capable of forming a film by a plasma free film forming apparatus, such as an EB vapor deposition apparatus and a pulse laser vapor deposition apparatus. Examples thereof include a metal, an alloy, a metallic oxide, a metallic nitride, a metallic boride, an organic electroconductive compound and a mixture thereof, and specific examples thereof include an electroconductive metallic oxide, such as tin oxide, zinc oxide, indium oxide, indium zinc oxide (IZO), indium tin oxide (ITO) and indium tungsten oxide (IWO), a metallic nitride, such as titanium nitride, a metal, such as gold, platinum, silver, chromium, nickel and aluminum, a mixture and an stacked material of the metal and the electroconductive metallic oxide, an inorganic electroconductive substance, such as copper iodide and copper sulfide, an organic electroconductive material, such as polyaniline, polythiophene and polypyrrole, and an stacked product of at least one of these materials with ITO. Examples thereof also include those described in Y. Sawada, "Toumei Douden Maku no Shintenkai" (New Developments of Transparent Electroconductive Films), CMC Press (1999), Y. Sawada, "Toumei Douden Maku no Shintenkai II" (New Developments of Transparent Electroconductive Films II), CMC Press (2002), Japan Society for the Promotion of Science, "Toumei Douden Maku no Gijutu" (Techniques of Transparent Electroconductive Films), Ohmsha Co., Ltd. (1999).

Particularly preferred examples of the material for the transparent electrode film include ITO, IZO, $SnO_2$, ATO (antimony-doped tin oxide), ZnO, AZO (aluminum-doped zinc oxide), GZO (gallium-doped zinc oxide), $TiO_2$ and FTO (fluorine-doped tin oxide) The light transmittance of the transparent electrode film is preferably 60% or more, more preferably 80% or more, further preferably 90% or more, and still further preferably 95% or more, at the photoelectric conversion light absorption peak wavelength of the photoelectric conversion film contained in the photoelectric conversion device containing the transparent electrode film. The surface resistance of the transparent electrode film varies in preferred range thereof depending on whether it is a pixel electrode or a counter electrode, and whether the charge accumulation/transfer/readout part has a CCD structure or a CMOS structure. In the case where the transparent electrode film is used as a counter electrode, and the charge accumulation/transfer/readout part has a CMOS structure, the surface resistance of the transparent electrode is preferably 10,000Ω per square or less, and more preferably 1,000Ω per square or less. In the case where the transparent electrode film is used as a counter electrode, and the charge accumulation/transfer/readout part has a CCD structure, the surface resistance of the transparent electrode is preferably 1,000Ω per square or less, and more preferably 100Ω per square or less. In the case where the transparent electrode film is used as a pixel electrode, the surface resistance of the transparent electrode is preferably 1,000,000Ω per square or less, and more preferably 100,000Ω per square or less.

The conditions for forming the transparent electrode film will be described. The substrate temperature, on which the transparent electrode film is formed, is preferably 500° C. or less, more preferably 300° C. or less, further preferably 200° C. or less, and still further preferably 150° C. or less. The transparent electrode film may be formed under introduction of a gas, which is not particularly limited, and examples of the gas include argon, helium, oxygen and nitrogen. A mixed gas of them may also be used. In the case where the material is an oxide, oxygen is preferably used for preventing oxygen defects from being formed.

It is preferred that a voltage is applied to the photoelectric conversion film of the invention since the photoelectric conversion efficiency is improved. The applied voltage is not particularly limited, and the necessary voltage varies depending on the thickness of the photoelectric conversion film. The photoelectric conversion efficiency is improved by increasing the electric field applied to the photoelectric conversion film, but the electric filed applied is increased when the thickness of the photoelectric conversion film is decreased with the same applied voltage. Therefore, in the case where the thickness of the photoelectric conversion film is small, the applied voltage may be relatively small. The electric field applied to the photoelectric conversion film is preferably 10 V/m or more, more preferably $1 \times 10^3$ V/m or more, further preferably $1 \times 10^5$ V/m or more, particularly preferably $1 \times 10^6$ V/m or more, and most preferably $1 \times 10^7$ V/m or more. There is no particular upper limit in the applied electric field, but an excessive electric field is not preferred since an electric current flows in a dark condition, and the electric field is preferably $1 \times 10^{12}$ V/m or less, and more preferably $1 \times 10^9$ V/m or less.

The inorganic layer as the inorganic photoelectric conversion film of the invention will be described.

The light having been transmitted through the organic layer as an upper layer is then photoelectrically converted in the inorganic layer. As the inorganic layer, a pn-junction or a pin-junction of crystalline silicon, amorphous silicon or a compound semiconductor, such as GaAs, is generally used. The method disclosed in U.S. Pat. No. 5,965,875 may be used as an stacked structure therefor, which is such a constitution that a light receiving part is formed as an stacked layer by utilizing the wavelength dependency of the absorption coefficient of silicon, and color separation is performed in the depth direction thereof. In this case, color separation is performed by the light penetration depth of silicon, and thus the spectral range detected by each light receiving part becomes broad. However, since the aforementioned organic layer is provided as an upper layer, color separation is considerably improved by detecting the light having been transmitted through the organic layer in the depth direction of silicon. In particular, when the G layer is disposed in the organic layer, the light transmitted through the organic layer contains blue light and red light, and only color separation between blue light and red light is performed in the depth direction of silicon to improve the color separation. In the case where the organic layer contains the B layer and the R layer, the color separation is considerably improved by appropriately selecting the electromagnetic wave absorbing/photoelectric conversion part in the depth direction of silicon. In the case where the organic layer contains two layers, the function of the electromagnetic wave absorbing/photoelectric conversion part in silicon may be exerted for only one color, whereby the color separation is favorably attained.

The inorganic layer preferably has such a structure that plural photodiodes are stacked as multilayer in the depth direction of the semiconductor substrate per each pixel, and color signals corresponding to signal charge generated in each photodiode through absorption of light by the plural photodiodes is read out to the exterior. It is preferred that the plural photodiodes contain at least one of a first photodiode provided at the depth where blue light is absorbed, and a second diode provided at the depth where red light is absorbed, and a color signal readout circuit is provided for reading out the color signals corresponding to the signal charge generated in the plural photodiodes. According to the constitution, color separation can be performed without a color filter. In some cases, light of negatively sensitive component can be detected, and color imaging can be attained with good color reproducibility. It is preferred in the invention that the junction part of the first photodiode is formed at a depth of about 0.2 μm or less from the surface of the semiconductor substrate, and the junction part of the second photodiode is formed at a depth of about 2 μm or less from the surface of the semiconductor substrate.

The inorganic layer will be described in more detail. Preferred examples of the constitution of the inorganic layer include a light receiving element of a photoconductive type, a p-n junction type, a Schottky junction type, a PIN junction type or an MSN (metal-semiconductor-metal) type, and a phototransistor type light receiving element. In the invention, such a light receiving element is preferably used that regions of a first electroconductive type and regions of a second electroconductive type, which is opposite to the first electroconductive type, are plurally stacked, and the junction surfaces between the regions of the first electroconductive type and the second electroconductive type are formed at depths suitable for performing photoelectric conversion of light of plural wavelength ranges different from each other, respectively. The single semiconductor substrate is preferably single crystal silicon, by which color separation can be performed by utilizing the absorption wavelength characteristics depending on the depth direction of the silicon substrate.

As the inorganic semiconductor, an InGaN series, an InAlN series, an InAlP series and an InGaAlP series may also be used. An inorganic semiconductor of an n-GaN series is adjusted to have a maximum absorption value within a wavelength range of blue light by appropriately controlling the content of In, and thus has a composition, $In_xGa_{1-x}N$ (wherein $0 \leq x < 1$) This compound semiconductor can be produced by using an organic metal vapor phase growing method (MOCVD method). An InAlN series nitride compound semiconductor using Al, which is a 13 Group element as similar to Ga, can also be utilized as the short wavelength light receiving part as similar to the InGaN series. InAlP and InGaAlP, which perform lattice matching with a GaAs substrate, may also be used.

The inorganic semiconductor may have an embedded structure. The embedded structure is such a constitution that both ends of the short wavelength light receiving part are covered with a semiconductor different from the short wavelength light receiving part. The semiconductor covering the both ends is preferably a semiconductor having a band gap wavelength shorter than or equivalent to the band gap wavelength of the short wavelength light receiving part.

The organic layer and the inorganic layer may be joined in any mode. An insulating layer is preferably provided between the organic layer and the inorganic layer for electrically insulating them.

The junction preferably forms npn or pnpn from the light incident side. In particular, the pnpn junction is more preferred since a p-type layer is provided on the surface to increase the surface potential, whereby a positive hole generated in the vicinity of the surface and a dark electric current can be trapped to lower the dark electric current.

In the photodiode of this type, pn-junction diodes having four layers of pnpn in the depth direction of silicon are formed by providing an n-type layer, a p-type layer, an n-type layer and a p-type layer, which are diffused in this depth order from the surface of a p-type silicon substrate. Light incident on the surface side of the diode penetrates to a larger depth with a longer wavelength, in which the incident light wavelength and the attenuation coefficients are values inherent to silicon, and thus the device is designed in such a manner that the depths of the pn-junctions cover the respective wavelength regions of visible light, respectively. Similarly, a junction diode having three layers of npn can be obtained by forming an n-type layer, a p-type layer and an n-type layer in this order. A light signal is taken out from the n-type layer, and the p-type layer is grounded.

Extraction electrodes are provided to each region, to which a prescribed reset voltage, whereby the regions are depleted, and capacities of the junctions become infinitely small values. According to the operation, the capacity occurring at the junction surface can be extremely small.

In the invention, the photoelectric conversion device preferably has an ultraviolet ray absorbing layer and/or an infrared ray absorbing layer on the electromagnetic wave absorbing/photoelectric conversion part. The ultraviolet ray absorbing layer absorbs or reflects light having a wavelength of 400 nm or less and preferably has an absorptivity of 50% or more in a wavelength range of 400 nm or less. The infrared ray absorbing layer absorbs or reflects light having a wavelength of 700 nm or more and preferably has an absorptivity of 50% or more in a wavelength range of 700 nm or more.

The ultraviolet ray absorbing layer and the infrared ray absorbing layer can be formed by a known method. For example, such a method has been known that a mordant layer formed of a hydrophilic polymer, such as gelatin, casein, glue and polyvinyl alcohol, is provided on a substrate, and the mordant layer is added or died with a colorant having a desired absorption wavelength to form a colored layer. Furthermore, a method of using a colored resin having a certain kind of a coloring material dispersed in a transparent resin is also known. For example, a colored resin film formed by mixing a coloring material with a polyamino resin can be used as described in JP-A-58-46325, JP-A-60-78401, JP-A-60-184202, JP-A-60-184203, JP-A-60-184204 and JP-A-60-184205. A coloring material using a polyimide resin having photosensitivity may also be used.

A coloring material may be dispersed in an aromatic polyamide resin capable of providing a hardened film at 200° C. or less having a photosensitive group in the molecule disclosed in JP-B-7-113685, and a colored resin having a pigment dispersed therein as described in JP-B-7-69486 may also be used.

In the invention, a dielectric multilayer film is preferably used. The dielectric multilayer film is preferably used since it has a sharp wavelength dependency of light transmission.

The electromagnetic wave absorbing/photoelectric conversion parts are preferably separated with an insulating layer. The insulating layer can be formed with a transparent insulating material, such as glass, polyethylene, polyethylene terephthalate, polyether sulfone and polypropylene. Silicon nitride and silicon oxide may also be preferably used. A silicon nitride film formed by plasma CVD is preferably used in the invention owing to the high transparency thereof.

In order to prevent the photoelectric conversion device from suffering from damages on process and from being in contact with oxygen and water, a protective layer or a sealing layer. Examples of the protective layer include an inorganic material film, such as a diamond thin film, a metallic oxide and a metallic nitride, a polymer film, such as a fluorine resin, poly-p-xylene, polyethylene, a silicone resin and a polystyrene resin, and a photocurable resin. Silicon nitride and silicon oxide may also be preferably used. A silicon nitride film formed by plasma CVD is preferably used in the invention owing to the high transparency thereof. The CVD method includes various methods, such as an IPC-CVD method and a Cat-CVD method, in addition to a plasma-assisted method, which may be appropriately selected in the invention. A protective film having both barrier property as a protective film and flexibility can be obtained by using silicon nitride and silicon oxide as a multilayer structure. Silicon nitride having a compositional ratio near the stoichiometric composition exhibits good capability as a protective film and is preferably used. An organic EL element is produced by an ordinary mask method. The photoelectric conversion device of the invention requires such miniaturization that is equivalent to a CCD or CMOS imaging device, and therefore, a patterning process of an organic semiconductor by photolithography is necessarily employed. Therefore, the protective layer is demanded to have process durability on microfabrication in addition to the time lapse storage stability. As a result of investigations on the production process and the process durability of the photoelectric conversion device of the invention, it has been found that a protective film having a multilayer structure containing three or more layers is necessary.

It is also possible that the device is covered with glass, gas-impermeable plastics or a metal, and the device itself is packaged with a suitable sealing resin. In this case, a substance having high water absorbance may be incorporated in the package.

Such an embodiment is also preferred that a microlens array is formed above the light receiving element to improve the light collecting efficiency.

The charge transfer/readout part may be constituted by referring to JP-A-58-103166, JP-A-58-103165 and JP-A-2003-332551. Examples thereof include a constitution containing a semiconductor substrate having formed thereon MOS transistors for each pixel, and a constitution containing a CCD as an element. In the case of a photoelectric conversion device using MOS transistors, for example, charge is generated in the photoelectric conversion film by incident light passing through the electrode, and the charge (an electrons or a positive hole) reaches the electrodes through the photoelectric conversion film with an electric field formed between the electrodes upon applying a voltage to the electrodes. The charge then reaches the charge accumulation part of the MOS transistor and is accumulated in the charge accumulation part. The charge (an electron or a positive hole) accumulated in the charge accumulation part migrates to the charge readout part through switching of the MOS transistor and output as an electric signal. According to the operation, a full color image signal is input to the solid imaging device containing the signal processing part.

It is possible that after injecting a predetermined amount of bias charge to the accumulation diode (refresh mode), a prescribed amount of charge is accumulated (photoelectric conversion mode), and the signal charge is read out. The light receiving element may be used as it is as the accumulation diode, or the accumulation diode may be provided separately.

The signal readout operation will be described in more detail. The signal readout operation may be performed with an ordinary color readout circuit. The signal charge or signal electric current having been photoelectrically converted in the light receiving part is accumulated in the light receiving part itself or a capacitor attached thereto. The accumulated charge is read out with selection of pixel position by means of a MOS imaging device using an X-Y addressing system (i.e., a so-called CMOS sensor). Other examples of the address selecting system include such a method that each pixel is selected in sequence with a multiplexer switch and a digital shift register, so as to read out to a common output line as a signal voltage (or charge). A two-dimensionally arrayed X-Y addressing imaging device is known as a CMOS sensor. In this device, a switch provided on a pixel connected to an intersection of the X and Y axes is connected to a vertical shift register, and upon turning on the switch with a voltage from the vertical scanning shift register, a signal read out from a pixel provided in the same line is read out to the column output line. The signal is sequentially read out from the output end through a switch driven by the horizontal shift register.

The readout operation of output signal may be performed by using a floating diffusion detector or a floating gate detector. The S/N ratio can be improved by providing a signal amplification circuit on the pixel part or by using such a measure as correlated double sampling.

The signal processing operation may be applied with gamma correction with an ADC circuit, digitalization with an AD converter, a brightness signal processing and a color signal processing. Examples of the color signal processing include a white balance processing, a color separation processing and a color matrix processing. In the case where the signal is applied to the NTSC signal, a conversion processing from RGB signal to YIQ signal may be performed.

It is necessary that the charge mobility of the charge transfer/readout part is 100 cm$^2$/V sec or more, and the charge mobility can be obtained by selecting the material therefor from semiconductors belonging to the IV Group, the III to V Groups and the II to VI Groups. Among these, a silicon semiconductor (hereinafter, sometimes referred to as Si semiconductor) is preferred owing to the advanced miniaturization technique therefor and the low cost. Various structures and systems have been proposed for the charge transfer/readout part, and the MOS system and a CCD system are preferred although any of them may be used. Particularly preferred examples thereof include a device using an Si semiconductor having a MOS structure. In the invention, the CMOS structure is preferred in many cases from the standpoint of high-speed readout, pixel addition, partial readout and electric power consumption. The signal readout operation may be performed by utilizing either charge of an electron or a positive hole.

The plural contact parts connecting the electromagnetic wave absorbing/photoelectric conversion parts and the charge transfer/readout part may be formed of any metal, and is preferably selected from copper, aluminum, silver, gold, chromium and tungsten, and particularly preferably copper. It is necessary that the contact parts are provided corresponding to the plural electromagnetic wave absorbing/photoelectric conversion parts, respectively, with the charge transfer/readout part. In the case where an stacked structure containing plural photosensitive units of blue light, green light and red light, it is necessary that the extraction electrodes and the charge transfer/readout parts for blue light, green light and red light are respectively connected.

The stacked photoelectric conversion device of the invention can be produced by the so-called microfabrication process used for producing a known integrated circuit. The process basically contains repetition of operations of pattern exposure with active light or an electron beam (such as an i- or g-line of mercury, excimer laser, an X-ray and an electron beam) pattern formation by development and/or burning, arrangement of element forming materials (such as coating, vapor deposition, sputtering and CV), and removal of the material in the non-pattern part (such as heat treatment and dissolution treatment).

The chip size of the device may be the brownie size, the 135 size, the APS size, $\frac{1}{1.8}$ inch and smaller sizes. The pixel size of the stacked photoelectric conversion device of the invention is expressed in terms of a circle equivalent diameter corresponding to the maximum area of the plural electromagnetic wave absorbing/photoelectric conversion parts. The pixel size is not particularly limited and is preferably from 2 to 20 μm, more preferably from 2 to 10 μm, and particularly preferably from 3 to 8 μm.

In the case where the pixel size exceeds 20 μm, the resolution is lowered, and in the case where the pixel size is smaller than 2 μm, the resolution is also lowered due to radio interference between sizes.

The photoelectric conversion device of the invention can be used in a video camera and is preferably used in a television camera. Other examples of the purposes thereof include a digital video camera, a security camera in such a location as an office building, a parking space, a bank branch and an automatic loan application machine, a shopping mall, a convenience store, an outlet mall, a department store, a pinball parlor, a karaoke booth, an amusement arcade and a hospital, various sensors for such an equipment as a video intercom, a personal authentication sensor, a factory automation sensor, a domestic robot, an industrial robot and a piping inspection system, a medical sensor, such as an endoscope and a fundus camera, a video conference system, a videophone, a camera-equipped cellular phone, an automobile driving safety system, such as a rear monitor, a collision forecasting system and a lane keeping system, and a sensor for a video game.

Among these, the photoelectric conversion device of the invention is particularly suitable for a television camera. This is because miniaturization and weight saving of a television camera can be realized by omitting a color separation optical system. Furthermore, the device is particularly suitable for a television camera for high definition broadcasting owing to the high sensitivity and the high resolution thereof. The television camera for high definition broadcasting herein includes a camera for digital high definition broadcasting.

In the photoelectric conversion device of the invention, an optical low pass filter can be omitted, which is preferred since further high sensitivity and high resolution can be expected.

The photoelectric conversion device of the invention can be reduced in thickness and does not require a color separation optical system, and therefore, only one camera with the photoelectric conversion devices of the invention replaceable can deal with diverse needs of imaging, such as one segment shot including shooting objects requiring different sensitivities (such as different environments in brightness including daylight and nighttime, and combination of a stationary object and a moving object) and one segment shot including different requirements in spectral sensitivity or color reproducibility. Accordingly, a camera operator is free of carriage of plural cameras to lighten load. The photoelectric conversion devices to be replaced include those for the aforementioned objects, and photoelectric conversion devices for infrared imaging, monochrome imaging and changeover of dynamic ranges.

Figure 2:
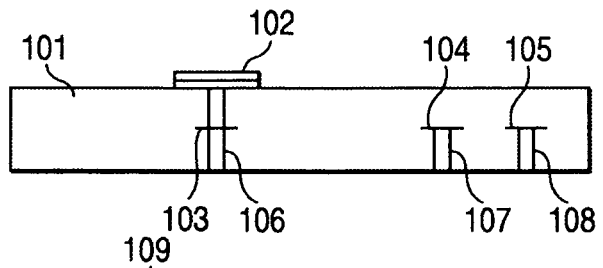
FIGS. 2A to 2F are illustrative views showing a formation process of a protective film having a multilayer structure containing three or more layers according to the invention.
Figure 2:
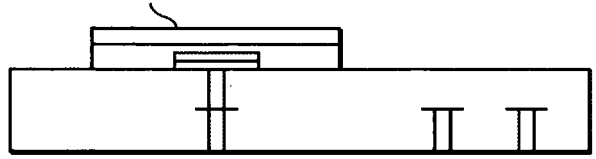
Figure 2:
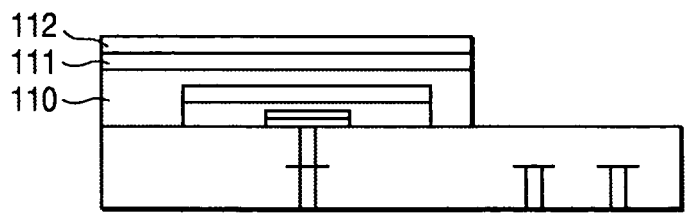
Figure 2:
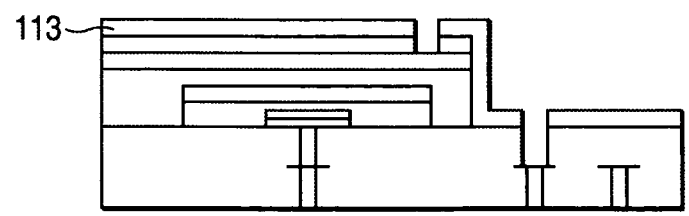
Figure 2:
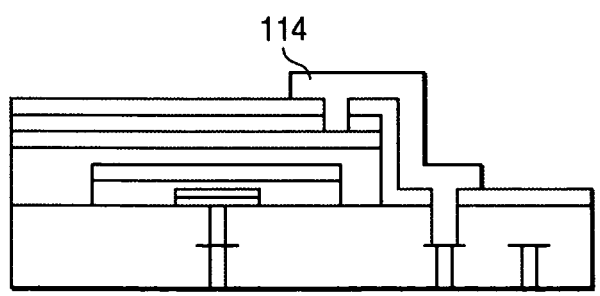
Figure 2:
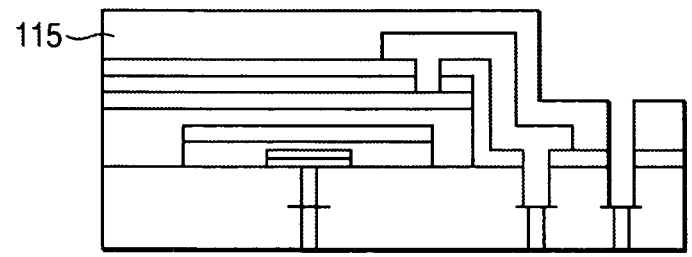

A television camera using the photoelectric conversion device of the invention can be produced with reference, for example, to "Television Camera no Sekkei Gijutu" (Design Techniques of Television Cameras), edited by the Institute of Image Information and Television Engineers (published on Aug. 20, 1999 by Corona Publishing Co., Ltd., ISBN 4-339-00714-5), chapter 2, in such a manner that, for example, the color separation optical system and the imaging device in the basic constitution of a television camera shown in FIG. 2.1 are replaced by the photoelectric conversion device of the invention.

The stacked light receiving element can be not only applied to an imaging device by arranging the plural elements, but also applied as a sole device to an optical sensor for a biosensor or a chemical sensor, and a color light receiving device.

EXAMPLE

Examples of the invention will be described below, but the invention is not construed as being limited thereto.

Example 1

Results showing the importance of the thickness of the insulating film between the organic photoelectric conversion film and the inorganic photoelectric conversion film are shown.

Devices were produced with a thickness of the organic photoelectric conversion film of 200 nm, a pixel electrode size of the organic photoelectric conversion film of 3 μm×3 μm, a thickness of the insulating film of 2 μm (invention), 6 μm (invention) or 10 μm (comparison), a thickness of the inorganic photoelectric conversion film of 200 nm, a pixel size of 3 μm×3 μm, a pitch width between pixels of 1 μm, and a uniform refractive index.

With the thickness of the insulating film of 2 μm, when the light flux applying a signal to the pixel of the organic photoelectric conversion film had an angle of about 30° from the photoelectric conversion film plane, a 100% signal was applied to the adjacent pixel of the inorganic photoelectric conversion film.

With the thickness of the insulating film of 6 μm, when the light flux applying a signal to the pixel of the organic photoelectric conversion film had an angle of about 55° from the photoelectric conversion film plane, a 100% signal was applied to the adjacent pixel of the inorganic photoelectric conversion film.

With the thickness of the insulating film of 10 μm, when the light flux applying a signal to the pixel of the organic photoelectric conversion film had an angle of about 70° from the photoelectric conversion film plane, a 100% signal was applied to the adjacent pixel of the inorganic photoelectric conversion film.

It was understood that in the case where the thickness of the insulating film was 2 μm or 6 μm, the signal did not blur to the adjacent pixel with an ordinary incident angle of light flux, but in the case where the thickness of the insulating film was 10 μm, the signal blurred to the adjacent pixel with an incident angle of light flux of 70°, whereby the resolution was deteriorated to fail to exhibit the performance of the multilayer photoelectric conversion device.

Example 2

In the case where the same devices were produced by changing the pixel size of the inorganic photoelectric conversion film to 6 μm×6 μm while maintaining the pixel electrode size of the organic photoelectric conversion film to 3 μm×3 μm, even when the angle formed between the incident light flux applying a signal to the pixel of the organic photoelectric conversion film and the photoelectric conversion film plane is decreased with the same thickness of the insulating film, the signal can be applied to the same pixel of the inorganic photoelectric conversion film. It was understood that the inorganic photoelectric conversion film performed photoelectric conversion of blue light or red light in the depth direction thereof, and it was effective to the multilayer photoelectric conversion device that the number of pixels of the organic photoelectric conversion film for green light was larger than the number of pixels of the inorganic photoelectric conversion film for blue light and red light.

Example 3

Results showing an improvement in S/N ratio in the multilayer structure of the organic photoelectric conversion film are shown.

A quartz substrate having a size of 2.5 cm square was cleaned under application of ultrasonic wave with acetone, Semicoclean (available from Furuuchi Co. Ltd.) and isopropyl alcohol (IPA) for 15 minutes each. After cleaning the substrate in boiling IPA finally, the substrate was subjected to UV/$O_3$ cleaning. On the substrate, an ITO film was formed by sputtering to a thickness of 20 nm through a mask having two patterns having a width of 5 mm and a spacing of 5 mm. The ITO film had a surface resistance of 500Ω per square. An n-type organic material, Alq3 (compound 1) and a p-type organic material, quinacridone (compound 2) were sequentially vapor-deposited by resistance heating in this order to 50 nm and 150 nm, respectively, on the substrate. Thereafter, an ITO film was formed by sputtering to a thickness of 20 nm in the same manner as above through the same mask having been changed in direction by 90°. The assembly was sealed with glass under a nitrogen atmosphere to obtain a device A (comparison).

A device B (comparison) was produced in the same manner as in the production of the device A except that the organic material was changed to a positive hole blocking material, BCP (compound 3) with a thickness of 30 nm, an n-type organic material, Alq3 (compound 1) with a thickness of 50 nm, and a p-type organic material, quinacridone (compound 2) with a thickness of 150 nm.

A device C (invention) was produced in the same manner as in the production of the device A except that the organic material was changed to a positive hole blocking material, BCP (compound 3) with a thickness of 30 nm, an n-type organic material, Alq3 (compound 1) with a thickness of 50 nm, a p-type organic material, quinacridone (compound 2) with a thickness of 150 nm, and an electron blocking material, m-MTDATA (compound 4) with a thickness of 40 nm.

A device D (invention) was produced in the same manner as in the production of the device A except that the organic material was changed to a positive hole blocking material, BCP (compound 3) with a thickness of 30 nm, an n-type organic material, Alq3 (compound 1) with a thickness of 20 nm, a co-deposited layer of an n-type organic material, Alq3 (compound 1) and a p-type organic material, quinacridone (compound 2) with a thickness of 200 nm, a p-type organic material, quinacridone (compound 2) with a thickness of 30 nm, and an electron blocking material, m-MTDATA (compound 4) with a thickness of 40 nm.

The device A had an organic photoelectric conversion film having a two-layer structure, the device B had an organic photoelectric conversion film having a three-layer structure, the device C had an organic photoelectric conversion film having a four-layer structure, and the device D had an organic photoelectric conversion film having a five-layer structure.

Light was made incident on the intersection of 5 mm×5 mm of the upper electrode and the lower electrode with a positive bias voltage applied to the lower electrode, and the IPCE (incident photon-to-current conversion efficiency, i.e., photoelectric conversion efficiency) and the dark electric current were measured. Upon applying a bias voltage changed to provide a dark electric current of $100\,nA/cm^2$, the IPCE at 543 nm (green light) was 2%, 4%, 21% and 25% for the devices A, B, C and D, respectively. The capability as an organic photoelectric conversion film was considerably improved in the devices C and D, i.e., the organic photoelectric conversion film having a multilayer structure containing four or more layers according to the invention.

The chemical structures of the compounds 1 to 4 are shown below.

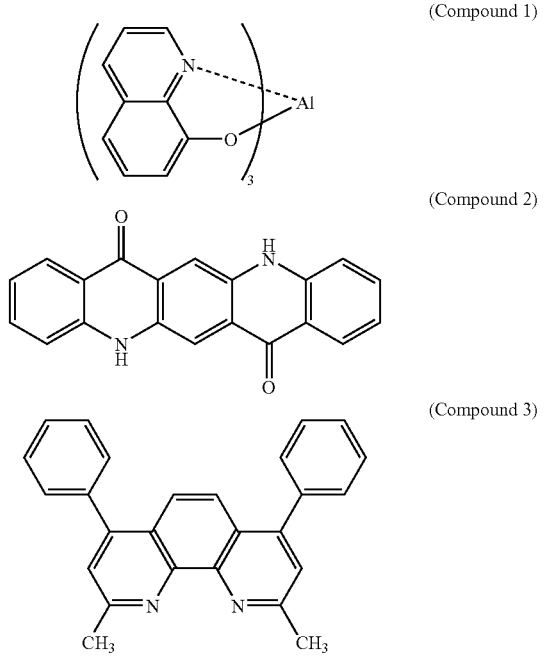

(Compound 1)

(Compound 2)

(Compound 3)

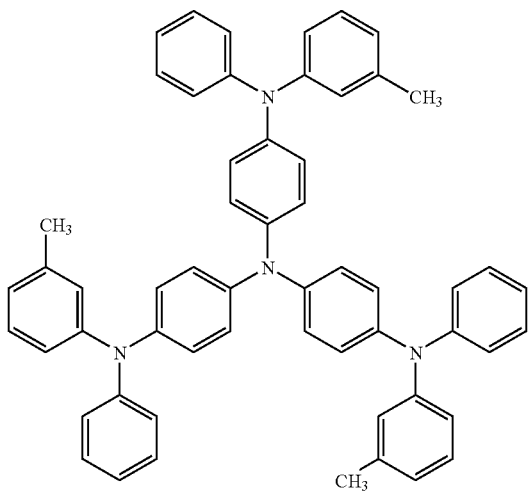

(Compound 4)

Example 4

Results showing the effect of the invention depending on the thickness of the transparent electroconductive film are shown.

10 pieces of each of devices E, F and G were produced in the same manner as in the production of the device C in Example 3 except that the thickness of the ITO film as the upper electrode was changed to 10 nm (invention), 40 nm (invention) and 100 nm (comparison), respectively.

The probability of short circuit was measured with a circuit tester and was 0% for the device C, 10% for the device F and 40% for the device G. It was understood that the yield ratio was considerably improved by making the thickness of the transparent electroconductive film to a range of from 5 to 50 nm. In the device E having an ITO film having a thickness of 10 nm, the IPCE was lower than the device C probably because the bias voltage could not be uniformly applied.

Example 5

Results showing the surface smoothness of the organic photoelectric conversion film are shown.

On a CMOS substrate having been produced by a 2.5 μm process, an IZO film was formed by sputtering instead of metal to a thickness of 20 nm (invention) or 100 nm (comparison). IZO pixel electrodes of 10 μm×10 μm were formed by the ordinary photolithography process including formation of a resist pattern, dry etching and removal of the resist. The spacing between the pixel electrodes was 1 μm. A positive hole blocking material (compound 5) with a thickness of 30 nm, an n-type organic material (compound 6) with a thickness of 50 nm, a p-type organic material (compound 7) with a thickness of 100 nm and an electron blocking material (compound 8) with a thickness of 40 nm were sequentially vapor-deposited by resistance heating on the substrate. Thereafter, an IZO film was formed thereon by sputtering to a thickness of 20 nm. The assembly as a specimen of the invention was cut by focused-ion-beam (FIB) cutting at a cross section passing through the center of the pixel electrode, and the cross section was observed with an SEM with a 100 μm length to obtain the surface smoothness on the interface between the compound 5 and the IZO film. The surface smoothness was 6 nm with the thickness of the IZO film of 20 nm, which was within 3% or less of the thickness of the organic photoelectric conversion film of 220 nm. In the comparative specimen, on the other hand, the surface smoothness was 27 nm with the thickness of the IZO film of 100 nm, which exceeded 10% of the thickness of the organic photoelectric conversion film of 220 nm. It was expected from the observation with an SEM that the upper electrode suffered from possibility of breakage when the surface smoothness exceeded 10% of the thickness of the organic photoelectric conversion film.

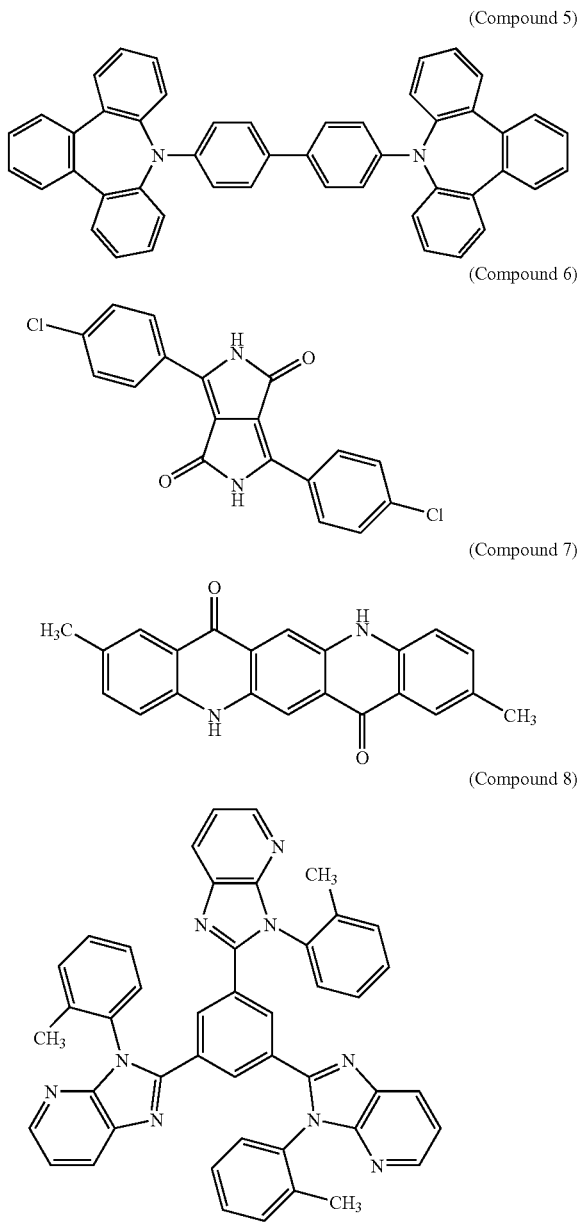

Example 6

Results showing the thickness of the protective layer are shown.

Devices H, I, J and K were produced in the same manner as in the production of the device D in Example 3 except that after forming the organic film and sputtering ITO, a silicon nitride film was formed by sputtering to a thickness of 0 μm (comparison), 0.47 μm (comparison), 1 μm (invention) or 5 μm (invention), respectively. No glass sealing was conducted.

The devices were stored at a temperature of 40° C. and a relative humidity of 80% for one month, and the change rate of IPCE (photoelectric conversion efficiency) was measured. The device H was decreased in IPCE to 13% of the initial performance, but the devices I, J and K were decreased to 75%, 100% and 100%, respectively. It was understood that the thickness of the protective film was necessarily 1 μm or more.

Example 7

An organic EL device is produced by the mask method. The photoelectric conversion device of the invention requires such miniaturization that is equivalent to a CCD or CMOS imaging device, and therefore, a patterning process of an organic semiconductor by photolithography is necessarily employed. Therefore, the protective layer is demanded to have process durability on microfabrication in addition to the time lapse storage stability. As a result of investigations on the production process and the process durability of the photoelectric conversion device of the invention, it has been found that a protective film having a multilayer structure containing three or more layers is necessary. The process therefor will be described with reference to FIGS. 2A to 2F.

In FIG. 2A, numeral 101 denotes a cross section of the insulating film as the uppermost layer between the inorganic photoelectric conversion film and the organic photoelectric conversion film. The lower layers are not shown in the figures. Numeral 102 denotes an electrode for connecting to the pixel electrode of the organic photoelectric conversion film and has a two-layer structure containing titanium nitride and AlCu. Numeral 103 denotes an intermediate metal, 104 and 105 denote a common counter electrode pad and a signal readout pad, respectively. Numeral 106, 107 and 108 denote plugs. The pixel electrode is reverse-sputtered with argon ion, and films of molybdenum and ITO are formed. After forming a resist pattern, etching and ashing of the resist are effected to obtain the constitution shown in FIG. 2B.

In FIG. 2B, numeral 109 denotes a cross section the pixel electrode having a two-layer structure containing molybdenum and ITO for the organic photoelectric conversion film. The organic photoelectric conversion film is vapor-deposited to a four-layer structure by a vacuum deposition method, and then an ITO film as the common counter electrode is formed by sputtering. A silicon nitride film as the first protective film is then formed by plasma CVD. The first protective film prevents damages of the organic film occurring on the etching process in the next step. After forming a resist pattern, silicon nitride, ITO and the organic film are sequentially dry-etched to obtain the constitution shown in FIG. 2C.

In FIG. 2C, numeral 110 denotes the organic photoelectric conversion film, 111 denotes the ITO common counter electrode, and 112 denotes a cross section of the first protective film. A silicon nitride film as the second protective film is then formed by plasma CVD. The second protective film prevents damages of the organic film, particularly damages on the side surface of the organic film, occurring on formation of the contact electrode in the next step. After forming a resist pattern, dry etching and ashing of the resist are effected to obtain the constitution shown in FIG. 2D.

In FIG. 2D, numeral 113 denotes a cross section of the second protective film. A hole for connecting the common counter electrode and the common counter electrode pad has been formed. A molybdenum film is formed as the contact electrode, and after forming a resist pattern, dry etching of the contact electrode and ashing of the resist are effected to obtain the constitution shown in FIG. 2E.

In FIG. 2E, numeral 114 denotes a cross section of the molybdenum contact electrode. A silicon nitride film as the third protective film is formed by plasma CVD. The third protective film prevents damages of the organic film and the contact electrode occurring on the etching process for forming a hole of the signal readout pad in the next step. After forming a resist pattern, dry etching and ashing of the resist are effected to obtain finally the constitution shown in FIG. 2F.

In FIG. 2F, numeral 115 denotes a cross section of the third protective film.

While a protective film having a multilayer structure containing three layers has been described, it is understood that the fourth or more protective layers may be provided to suppress damages of the organic film on the process steps.

According to the invention, a photoelectric conversion device containing an inorganic photoelectric conversion film having stacked thereon an organic photoelectric conversion film is improved in color reproducibility, SN ratio, time lapse stability and process durability upon microfabrication.

The entire disclosure of each and every foreign patent application from which the benefit of foreign priority has been claimed in the present application is incorporated herein by reference, as if fully set forth.

What is claimed is:

1. A photoelectric conversion device comprising:
   an inorganic photoelectric conversion film;
   an insulating film; and
   an organic photoelectric conversion film held between two transparent electroconductive films, in this order,
   and further comprising a signal readout section having a MOS structure,
   wherein:
   the insulating film has a thickness of from 1 to 6 μm;
   at least one of the two transparent electroconductive films has a thickness of from 5 to 50 nm and comprises an electroconductive metallic oxide
   the inorganic photoelectric conversion film performs photoelectric conversion of at least blue light and red light;
   the organic photoelectric conversion film performs photoelectric conversion of at least green light;
   the number of pixels for green light is larger than the number of pixels for blue light or red light;
   one of the two transparent electroconductive films nearer the inorganic photoelectric conversion film forms a pixel electrode;
   one of the two transparent electroconductive films farther from the inorganic photoelectric conversion film forms a common electrode, and;
   the organic photoelectric conversion film is formed continuously without separation for each pixel.

2. The photoelectric conversion device according to claim 1,
   wherein the inorganic photoelectric conversion film comprises a silicon semiconductor, and the inorganic photoelectric conversion film performs photoelectric conversion of at least blue light and red light separately in a depth direction of the silicon semiconductor.

3. The photoelectric conversion device according to claim 1,
   wherein the organic photoelectric conversion film performing photoelectric conversion of green light has a maximum absorption wavelength of from 510 to 560 nm, a maximum absorptivity of from 80 to 100% and a half value width of absorptivity of from 50 to 100 nm.

4. The photoelectric conversion device according to claim 1, which further comprises a protective film having a multilayer structure comprising three or more layers directly or indirectly on one of the two transparent electroconductive films farther from the inorganic photoelectric conversion film.

5. The photoelectric conversion device according to claim 1,
   wherein the organic photoelectric conversion film has a surface smoothness that is 1/10 or less of a thickness of the organic photoelectric conversion film.

6. The photoelectric conversion device according to claim 4, which further comprises at least one film selected from an antireflection film, an infrared ray shielding film and an ultraviolet ray shielding film directly or indirectly on the protective film.

7. The photoelectric conversion device according to claim 1, which further comprises at least one color reproduction compensating layer at least one of above and under the organic photoelectric conversion film.

8. The photoelectric conversion device according to claim 1,
   wherein the signal readout section utilizes an electron as a readout signal.

9. The photoelectric conversion device according to claim 1,
   wherein the signal readout section utilizes a positive hole as a readout signal.

10. An imaging device comprising a photoelectric conversion device according to claim 1.

11. The photoelectric conversion device according to claim 7, which comprises a color reproduction compensating layer provided above and/or under the organic photoelectric conversion film performing photoelectric conversion of green light.

* * * * *